United States Patent
Kimura

Patent Number: 5,485,119
Date of Patent: Jan. 16, 1996

[54] MOS TRANSCONDUCTANCE AMPLIFIER HAVING SQUARING CIRCUIT FOR LSI IMPLEMENTATION

[75] Inventor: Katsuji Kimura, Tokyo, Japan

[73] Assignee: NEC Corporation, Tokyo, Japan

[21] Appl. No.: 401,673

[22] Filed: Mar. 10, 1995

[30] Foreign Application Priority Data

Jul. 12, 1994 [JP] Japan ................................ 6-182877

[51] Int. Cl.$^6$ ........................................ H03F 3/45
[52] U.S. Cl. ..................... 330/253; 327/349; 330/257
[58] Field of Search ................................. 327/349, 356, 327/359; 330/253, 257, 261, 156

[56] References Cited

U.S. PATENT DOCUMENTS

| | | | |
|---|---|---|---|
| 5,107,150 | 4/1992 | Kimura | 327/349 |
| 5,381,113 | 1/1995 | Kimura | 330/253 |

OTHER PUBLICATIONS

A. Nedungadi ete al, "Design of Linear CMOS Transconductance Elements", *IEEE Transaction on Circuits and Systems*, vol. CAS-31, No. 10, Oct. 1984, pp. 891-894.

*Primary Examiner*—Steven J. Mottola
*Attorney, Agent, or Firm*—Sughrue, Mion, Zinn, Macpeak & Seas

[57] ABSTRACT

In a MOS operational transconductance amplifier including a MOS transistor differential pair, first to fourth current mirrors are provided between a voltage supply and a reference potential. The second and fourth current mirrors are connected together to a common node to which the channels of MOS transistor differential pair are connected. A first MOS transistor is connected between the voltage supply and a first constant current sink, and a second MOS transistor is connected at one end to the first current mirror and at the other end to the first constant current sink and the second current mirror. A third MOS transistor is connected at one end to the third current mirror and at the other end to the second constant current sink and the fourth current mirror, and a fourth MOS transistor is connected between the voltage supply and the second constant current sink. An input voltage is applied across the gates of the MOS differential pair as well as across first and second terminals to which the gates of the first and third MOS transistors and the gates of the second and fourth MOS transistors are connected. The first and second current mirrors and the second MOS transistor form a bootstrapping loop so that the second current mirror produces at the node a current equal to a sum of a constant current produced by the first constant current sink and a current equal to the drain current of one of the first and second MOS transistors. The third and fourth current mirrors and the third MOS transistor form another bootstrapping loop so that the fourth current mirror produces at the node a current equal to a sum of a constant current produced by the second constant current sink and a current equal to the drain current of one of the third and fourth MOS transistors.

9 Claims, 8 Drawing Sheets

SQUARING CIRCUIT 22

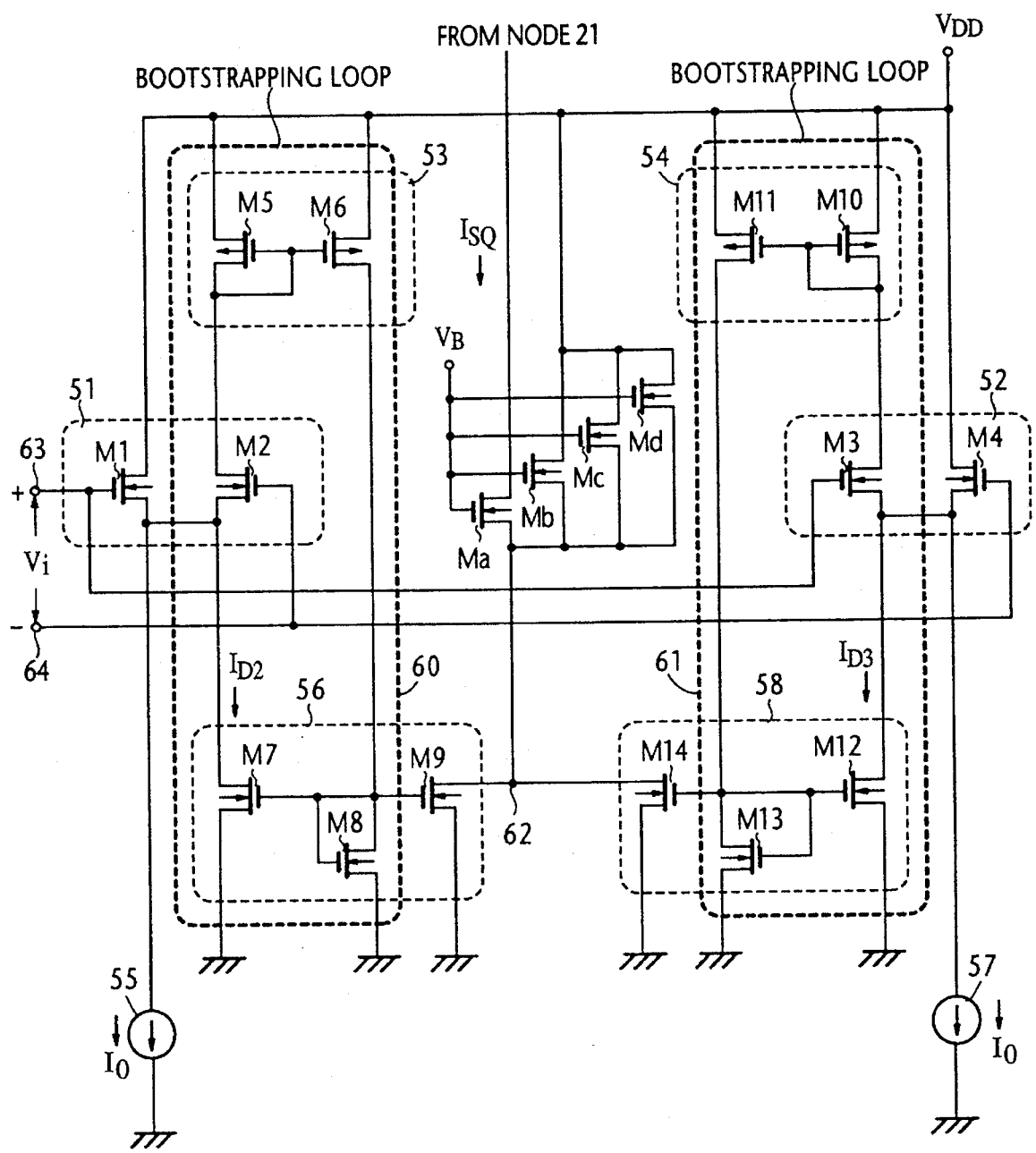

SQUARING CIRCUIT 22

SQUARING CIRCUIT 22

MOS TRANSCONDUCTANCE AMPLIFIER HAVING SQUARING CIRCUIT FOR LSI IMPLEMENTATION

BACKGROUND OF THE INVENTION

1. Field of the Invention

The present invention relates generally to metal oxide semiconductor (MOS) operational transconductance amplifier for providing linear amplification of an analog input voltage to produce an amplified analog output current, and more specifically to a MOS operational transconductance amplifier suitable for LSI implementation.

2. Description of the Related Art

An operational transconductance amplifier is described in a paper "Design of Linear CMOS Transconductance Elements", Nedungadi et al, IEEE Transactions on Circuits and Systems, Vol. CAS-31, No. 10, October 1984, pages 891–894. The known transconductance amplifier includes four transistors connected in an unbalanced cross-coupled quad cell configuration for supplying a bias current to a MOS differential pair to which an input voltage is applied. To optimize the bias current for linear operation of the transconductance amplifier, it is necessary to set the width-to-length ratio of the channels of the quad cell transistors at $1:(1+2/\sqrt{3})$. However, the ratio of this value is impractical for LSI implementation in so far as linear amplification is concerned.

SUMMARY OF THE INVENTION

It is therefore an object of the present invention to provide a MOS operational transconductance amplifier which can be implemented using LSI technology.

According to a first aspect, the present invention provides a MOS operational transconductance amplifier which comprises a MOS transistor differential pair having gate terminals for receiving an input voltage thereacross and having channels connected together to a common node, and a squaring circuit. The squaring circuit comprises first and second constant current sinks connected to a reference potential, a first current mirror connected to a voltage supply, and a second current mirror connected to the reference potential. A third current mirror is connected to the voltage supply, and a fourth current mirror is connected to the reference potential, the second and fourth current mirrors being connected together to the common node. The channel of a first MOS transistor is connected between the voltage supply and the first constant current sink, and the channel of a second MOS transistor is connected at one end to the first current mirror and at the other end to the first constant current sink and the second current mirror. The channel of a third MOS transistor is connected at one end to the third current mirror and at the other end to the second constant current sink and the fourth current mirror, and the channel of a fourth MOS transistor is connected between the voltage supply and the second constant current sink. The gate terminals of the first and third MOS transistors are coupled together and the gate terminals of the second and fourth MOS transistors are coupled together to receive the input voltage. The first and second current mirrors and the second MOS transistor are connected to form a first bootstrapping loop so that the second current mirror produces at the node a first current equal to a sum of a constant current produced by the first constant current sink and a current equal to a drain current produced by one of the first and second MOS transistors. The third and fourth current mirrors and the third MOS transistor are connected to form a second bootstrapping loop so that the fourth current mirror produces at the node a second current equal to a sum of a constant current produced by the second constant current sink and a current equal to a drain current produced by one of the third and fourth MOS transistors. The first and second currents are combined together at the node to drive the MOS transistor differential pair.

According to a second aspect, the present invention provides a MOS operational transconductance amplifier comprising a MOS transistor differential pair having gate terminals connected respectively to input terminals for receiving an input voltage thereacross and having channels connected together to a first node. A first current mirror is connected to a voltage supply, and a second current mirror is connected to a reference potential and a second node connected to the first node. A first MOS transistor has a channel connected between the first current mirror and a constant current sink, and a second MOS transistor has a channel connected at one end to the first current mirror and at the other end to the constant current sink and the second current mirror, the gate terminals of the first and second MOS transistors being connected respectively to the input terminals. First and second resistors of equal value are connected in series between the gate terminals of the first and second MOS transistors. A third MOS transistor is provided having a channel connected between the voltage supply and the constant current sink, the gate terminal thereof being connected to a node formed between the first and second resistors. The first and second current mirrors and the second MOS transistor are connected to form a bootstrapping loop so that the second current mirror produces at the second node a current equal to a sum of a constant current produced by the constant current means and a current equal to a drain current produced by one of the first and second MOS transistors.

BRIEF DESCRIPTION OF THE DRAWINGS

The present invention will be described in further detail with reference to the accompanying drawings, in which:

FIG. 5C is a circuit diagram of the squaring circuit according to a third embodiment of the present invention wherein the output current of the squaring circuit is scaled at ¼ of the output current of FIG. 5A;

DETAILED DESCRIPTION

Figure 1:
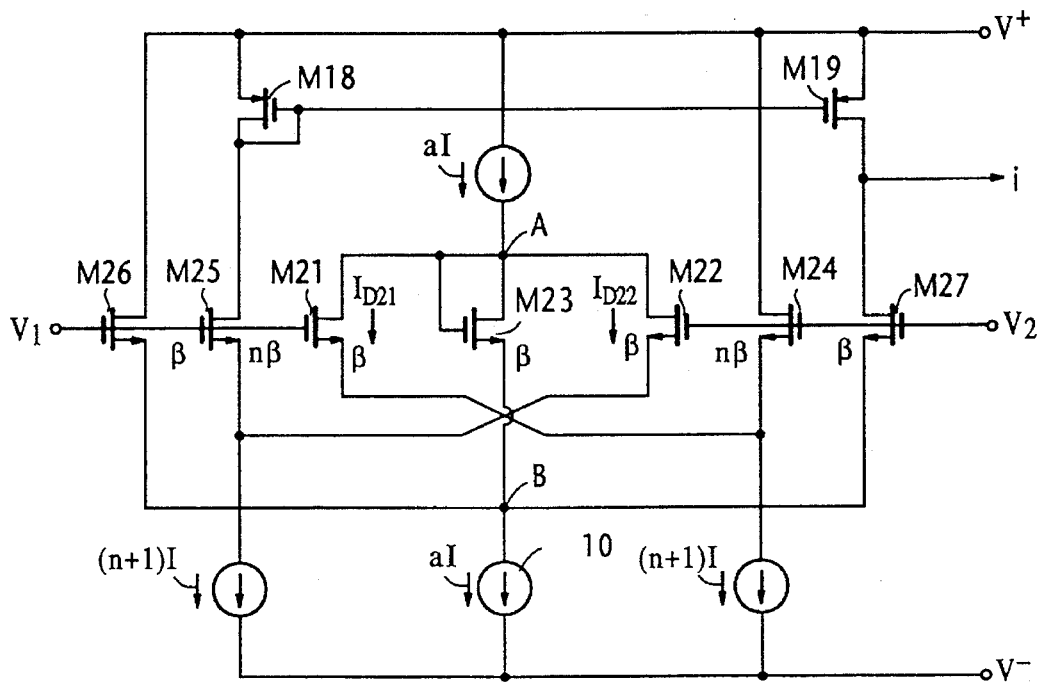
FIG. 1 is a block diagram of a prior art MOS (metal oxide semiconductor) operational transconductance amplifier.

Before proceeding with the detailed description of the present invention, it may prove helpful to provide an explanation of the Nedungadi et al's operational transconductance amplifier with reference to FIG. 1. The prior art transconductance amplifier includes MOS transistors M18 to M27, wherein the transistors M18 and M19 form a current mirror circuit. The transistors M21 and M24 constitute a first unbalanced differential pair and the transistors M22 and M25 a second unbalanced differential pair, which pairs are connected in a cross-coupled quad cell configuration to operate as a squaring circuit. The output current (tail current) of the squaring circuit is used to drive the transistors M26 and M27 which form a differential pair. By operating the differential pair with an optimum bias, the transistors M26 and M27 operate as a linear amplifier for a specified range of input voltages. The transistor M23 and a current sink 10 are used to level shift the summed drain currents of M21 and M22 from the node A to the node B.

The following mathematical analysis of the circuit of FIG. 1 gives a tail current for the squaring circuit that is necessary for the differential pair (M26 and M27) to operate as a linear amplifier. It is assumed that semiconductor elements fabricated on a common chip have excellently matched characteristics and that the effect of channel-length modulation and the body effect are ignored. The relationship between the drain current $I_{Di}$ of a saturated MOS transistor and the gate-source voltage $V_{GSi}$, if it follows the square-law, is given by Equations 1a and 1b:

$$I_{Di} = \beta(V_{GSi} - V_{TH})^2 \quad (\text{if } V_{GSi} \geq V_{TH}) \quad (1a)$$

$$I_{Di} = 0 \quad (\text{if } V_{GSi} \leq V_{TH}) \quad (1b)$$

where, $V_{TH}$ is the threshold voltage and $\beta = \mu(C_{ox}/2)(W/L)$, where $\mu$ is the effective surface carrier mobility, $C_{ox}$ is the gate oxide capacitance per unit area, and W and L are the width and length of the channel, respectively. The output current $\Delta I_D$ of the MOS differential pair (M26, M27) that is driven by a tail current $I_{SS}$ is given Equations (2a) and (2b) as follows:

$$\Delta I_D = \begin{cases} \beta V_i \sqrt{\dfrac{2 I_{ss}}{\beta} - V_i^2} & \left(\text{if } |V_i| \leq \sqrt{\dfrac{I_{ss}}{\beta}}\right) \quad (2a) \\ I_{ss} \operatorname{sgn}(V_i) & \left(\text{if } |V_i| \geq \sqrt{\dfrac{I_{ss}}{\beta}}\right) \quad (2b) \end{cases}$$

Since the tail current $I_{SS}$ is proportional to the square of the input voltage, the nonlinearity of the transconductance of the MOS differential pair is completely compensated and therefore the tail current for optimizing the bias for the M26–M27 differential pair is given by:

$$I_{SS} = I_0 + (\tfrac{1}{2})\beta V_i^2 \quad (3)$$

As a result, the output current $I_L$ of the unbalanced cross-coupled quad cell formed by transistors M21, M24, M22 and M25 is given by Equations (4a), (4b) and (4c) as follows:

$$I_L = aI - (I_{D21} + I_{D22}) \quad (4a)$$

$$= aI - \frac{2n}{n+1} I + 2\frac{n(n-1)}{(n+1)^2} \beta V_i^2$$

$$\left(\text{if } |V_i| \leq \sqrt{\frac{(n+1)I}{n\beta}}\right)$$

$$= aI + \frac{3n-1}{2n+1} I + \quad (4b)$$

$$\frac{n(n+1)\beta V_i^2 + 2n\beta |V_i| \sqrt{(n+1)^2 \frac{I}{\beta} - nV_i^2}}{(n+1)^2}$$

$$\left(\text{if } \sqrt{\frac{(n+1)I}{n\beta}} \leq |V_i| \leq \sqrt{\frac{(n+1)I}{\beta}}\right)$$

$$= aI \quad \left(\text{if } |V_i| \geq \sqrt{\frac{(n+1)I}{\beta}}\right) \quad (4c)$$

where $I_{D21}$ and $I_{D22}$ are the drain currents of transistors M21 and M22, respectively, and n is the ratio between the two channel's width-to-length ratios (=W/L), i.e., the ratio between the $\beta$-values of these transistors.

Since Equation (4a) must be equal to Equation (3), it is necessary to set the tail current $I_{SS}$ as:

$$I_{SS} = aI - \frac{2n}{n+1} I + 2\frac{n(n-1)}{(n+1)^2} \beta V_i^2 = I_0 + \frac{1}{2} \beta V_i^2 \quad (5)$$

Therefore, the transconductance $g_m$ can be held at a constant value as given by Equation (6) for an input voltage $V_i$ in the range $|V_i| \leq \sqrt{(n+1)I/(n\beta)}$:

$$g_m = \sqrt{\{a - 2n/(n+1)\}(I/\beta)} \quad (6)$$

The square terms of Equation (5) are made equal to each other by setting Equation (7) as follows:

$$2n(n-1)/(n+1)^2 = \tfrac{1}{2} \quad (7)$$

By solving Equation (7) for n, $n = 1 + 2/\sqrt{3} (= 2.1547)$ is obtained.

Figure 2:
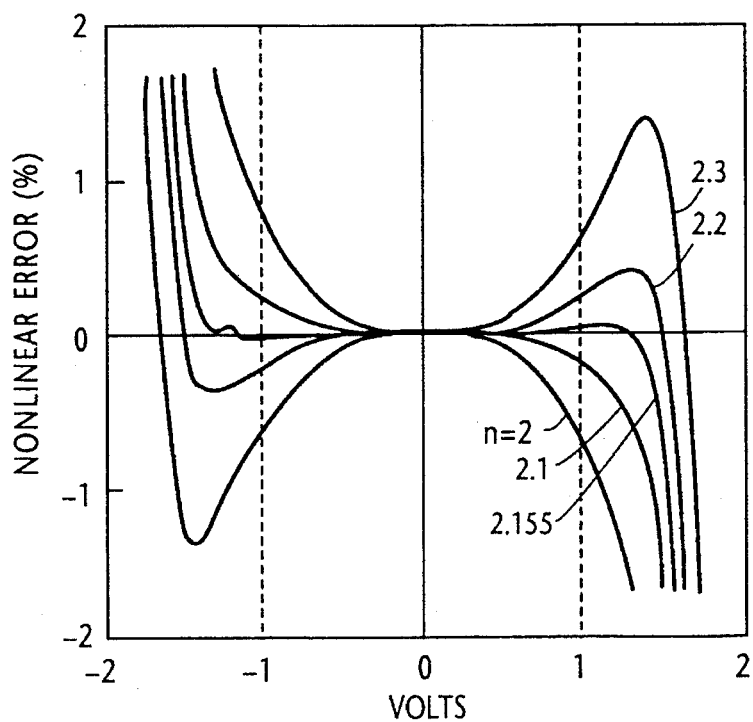
FIG. 2 is a graphic representation of the results of the SPICE simulation performed on the prior art transconductance amplifier.

The SPICE simulation undertaken by Nedungadi et al for n=2, n=2.1, n=2.155, n=2.2 and n=2.3 indicates that the nonlinear error of transconductance for n=2.155 is lower than 0.1% (FIG. 2).

However, the n-value of $1:1+2/\sqrt{3}$ is impractical for LSI implementations in so far as linear amplification is concerned. If this n-value is rounded, the bias current cannot be optimized for linear amplification.

Returning now to FIG. 3, the MOS operational transconductance amplifier of the present invention is schematically illustrated, wherein elements corresponding to those in FIG. 1 are marked with the same reference numerals. The amplifier of this invention comprises a current mirror circuit 20 which is formed by the MOS transistors M18 and M19 of FIG. 1. The drain terminals of MOS transistors M26 and M27 are connected to the current mirror circuit 20 and their source terminals coupled together to a node 21 to produce drain currents $I_{D26}$ and $I_{D27}$, respectively. The current mirror circuit 20 produces an output current equal to the difference between the drain currents $I_{D26}$ and $I_{D27}$.

According to the present invention, a squaring circuit 22 is connected to the MOS differential pair (M26, M27) to drive the transistors of the differential pair with a tail current $I_{SQ}$. The input voltage $V_i$ is supplied to the squaring circuit 22 as well as to the gate terminals of the MOS differential pair. The squaring circuit 22 converts the input voltage $V_i$ to the tail current $I_{SQ}$ and an output current $\Delta I$ is produced, which is obtained from the current mirror circuit 20.

Figure 3:
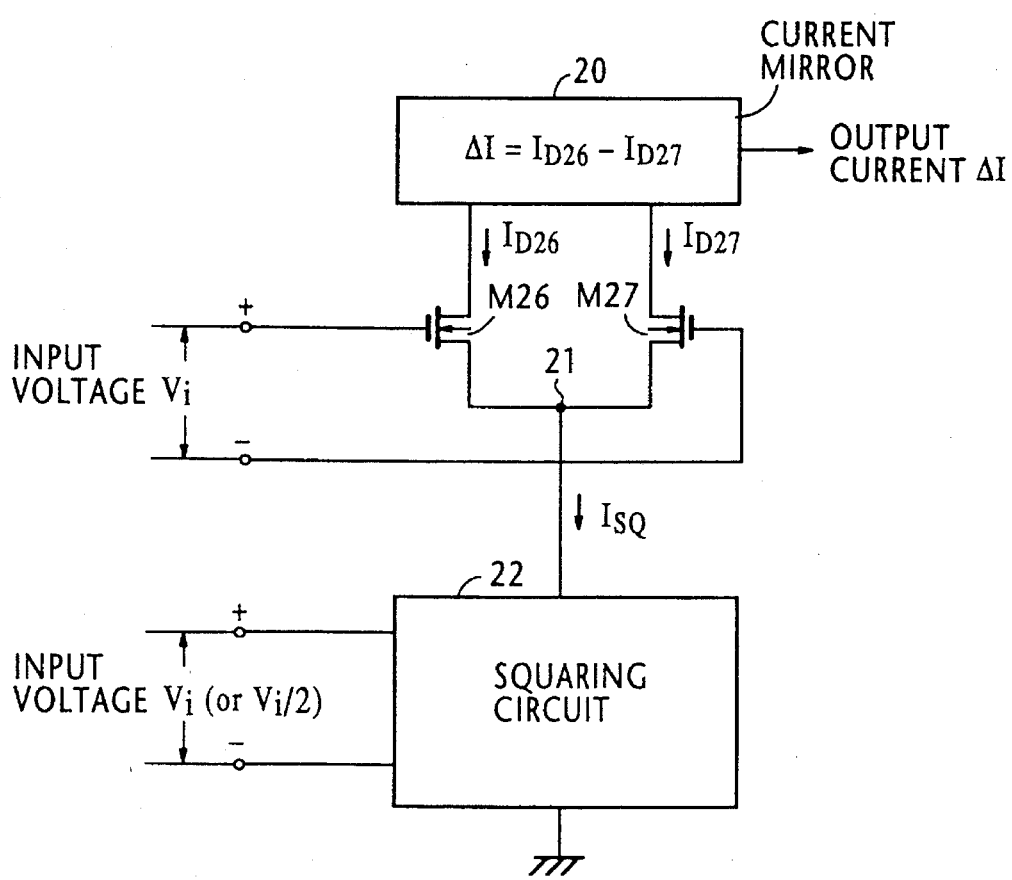
FIG. 3 is a schematic block diagram of the MOS operational transconductance amplifier of the present invention.
Figure 4:
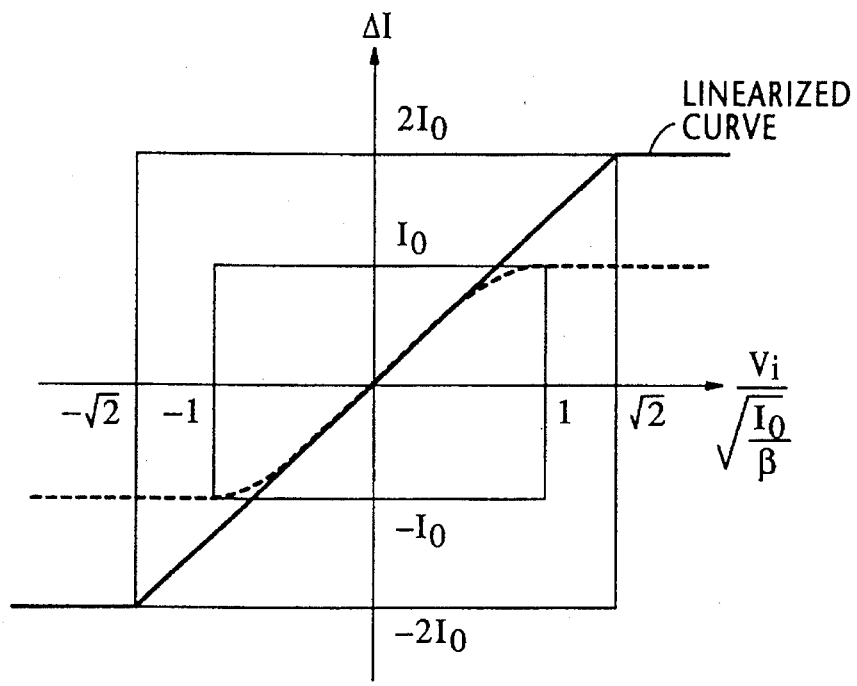
FIG. 4 is a graphic representation of an idealized input-to-output characteristic of the squaring circuit of the present invention.

If the MOS differential pair (M26, M27) Is driven by a constant current, the input-to-output characteristic of the transconductance amplifier of FIG. 3 will lose its linearity before the input voltage reaches +1 or −1 as indicated by broken lines in FIG. 4. However, the squaring circuit 22 provides bias optimization in such a manner that the linear amplification range of the transconductance amplifier extends to $\pm\sqrt{2}$ as indicated by a solid-line linearized curve in FIG. 4. The present invention is intended to provide a MOS operational transconductance amplifier whose linear amplification range approximates the linearized curve of FIG. 4.

Figure 5A:
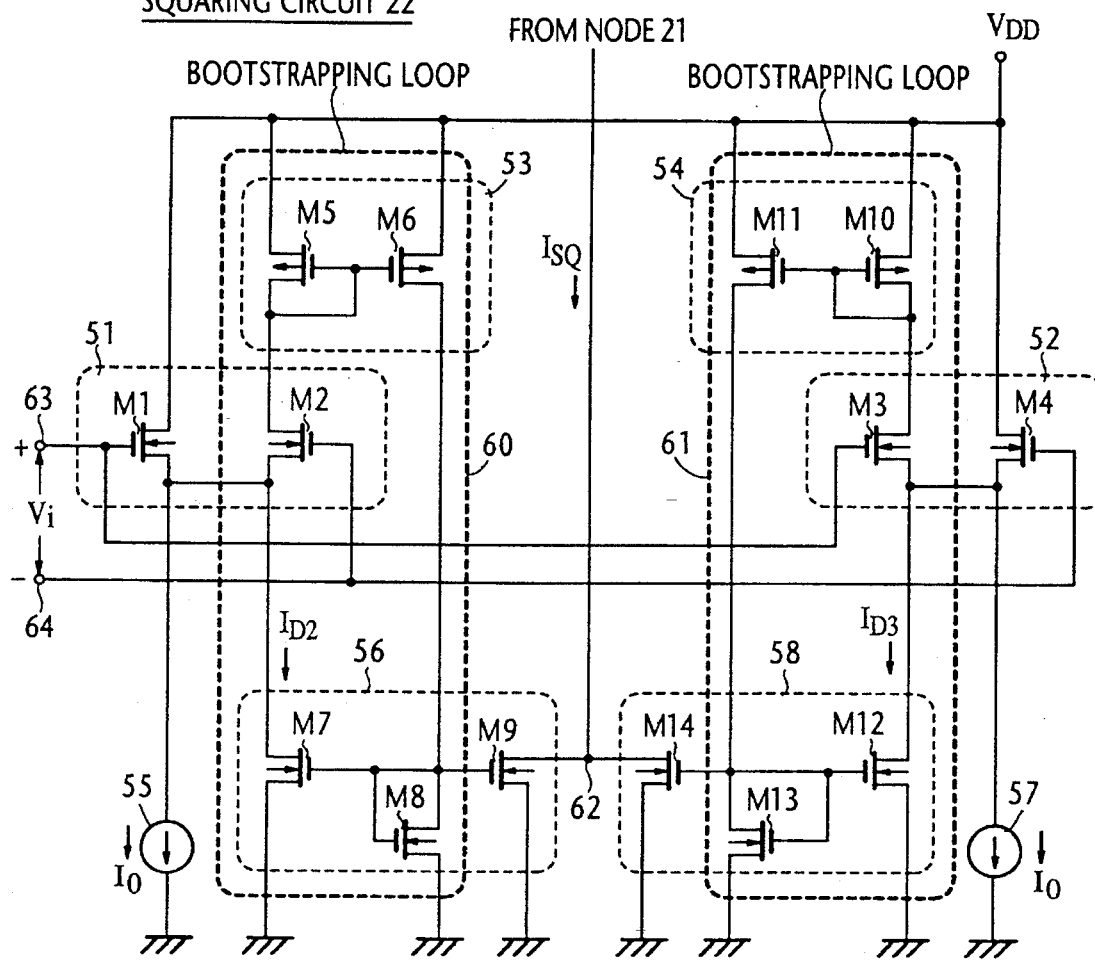
FIG. 5A is a circuit diagram of the squaring circuit according to a first embodiment of the present invention.

FIG. 5A shows details of the squaring circuit 22 according to an embodiment of the present invention. It is seen that the squaring circuit includes a first differential pair 51 formed by MOS transistors M1 and M2, and a second differential pair formed by MOS transistors M3 and M4. The drain terminals of transistors M1 and M4 are directly connected to a voltage supply $V_{DD}$. Whereas, the drain terminal of transistor M2 is connected to the $V_{DD}$ supply via a current mirror circuit 53 formed by MOS transistors M5 and M6, and the drain terminal of transistor M3 is connected to the $V_{DD}$ supply via a current mirror circuit 54 formed by MOS transistors M10 and M11. The source terminals of transistors M1 and M2 are coupled together to a constant current sink 55 (where current $I_0$ is passed to ground) as well as to a current mirror circuit 56 formed by MOS transistors M7, M8 and M9. In like manner, the source terminals of transistors M3 and M4 are coupled together to a constant current sink 57 as well as to a current mirror circuit 58 formed by MOS transistors M12, M13 and M14. Transistors M1, M2, M5 to M9 constitute a first differential circuit and transistors M3, M4, M10 to M14 constitute a second differential circuit and the output of each of these differential circuits is connected to the output of the other differential circuit at a node 62.

A first bootstrapping loop 60 is formed by transistors M2, M5, M6, M7 and M8 by coupling the drain-source paths of transistors M2 and M7 in series between transistor M5 and ground and coupling the drain-source path of transistor M8 between transistor M6 and ground. A second bootstrapping loop 61 is likewise formed by transistors M3, M10, M11, M12 and M13 by coupling the drain-source paths of transistors M3 and M12 in series between transistor M10 and ground and coupling the drain-source path of transistor M13 between transistor M11 and ground. Transistors M9 and M14 have their drain terminals connected together to the node 62 which leads to the node 21 to draw tail current $I_{SQ}$ and have their gate terminals coupled to the drain terminals of transistors M8 and M13, respectively.

The gate terminals of transistors M1 and M3 are coupled together to a positive voltage input terminal 63 and the gate terminals of transistors M2 and M4 are coupled together to a negative voltage input terminal 64. The input voltage $V_i$ is applied across the terminals 63 and 64, so that transistors M1 and M3 are driven together in opposite sense to transistors M2 and M4. Due to the bootstrapping loop 60, the second current mirror circuit 56 produces at the node 62 a first current equal to a sum of a constant current $I_0$ produced by the constant current sink 55 and a current equal to the drain current of one of the MOS transistors M1 and M2. Likewise, due to the bootstrapping loop 61, the fourth current mirror circuit 58 produces at the node 62 a second current equal to a sum of a constant current $I_0$ produced by the second constant current sink 57 and a current equal to the drain current of one of the MOS transistors M3 and M4. As a result, transistors M2 and M3 are driven by drain currents (dynamic bias currents) $I_{D2}$ and $I_{D3}$, respectively, which are given by:

$$I_{D2} = \beta \left( V_i - \sqrt{\frac{I_0}{\beta}} \right)^2 \left( \text{if } V_i \leq \sqrt{\frac{I_0}{\beta}} \right) \quad (8a)$$

$$I_{D2} = 0 \left( \text{if } V_i \geq \sqrt{\frac{I_0}{\beta}} \right) \quad (8b)$$

$$I_{D3} = \beta \left( -V_i - \sqrt{\frac{I_0}{\beta}} \right)^2 \left( \text{if } V_i \leq \sqrt{\frac{I_0}{\beta}} \right) \quad (8c)$$

$$I_{D3} = 0 \left( \text{if } V_i \geq \sqrt{\frac{I_0}{\beta}} \right) \quad (8d)$$

It is seen that each of these dynamic bias current exhibit the square-law characteristic. Each of the Equations (8a) and (8c) is equivalent to Equation (1a) in the sense that $V_{SGi}$ and $V_{TH}$ of Equation (1a) are substituted by $V_i$ and $\sqrt{I_0\beta}$, respectively. It is appreciated that Equations (8a) and (8c) are represented by such physical parameters which can be implemented by a computer program. Thus, the squaring circuit of this invention can be implemented on LSI chips.

The tail current $I_{SQ}$ is obtained by summing the dynamic bias currents $I_{D2}$ and $I_{D3}$ as follows:

$$I_{SQ} = I_{D2} + I_{D3}$$
$$= 2\beta V_i^2 + 2I_0 \left( \text{if } |V_i| \leq \sqrt{\frac{I_0}{\beta}} \right) \quad (9a)$$

$$= \beta \left( V_i + \sqrt{\frac{I_0}{\beta}} \right)^2 \left( \text{if } |V_i| \geq \sqrt{\frac{I_0}{\beta}} \right) \quad (9b)$$

Figure 6A:
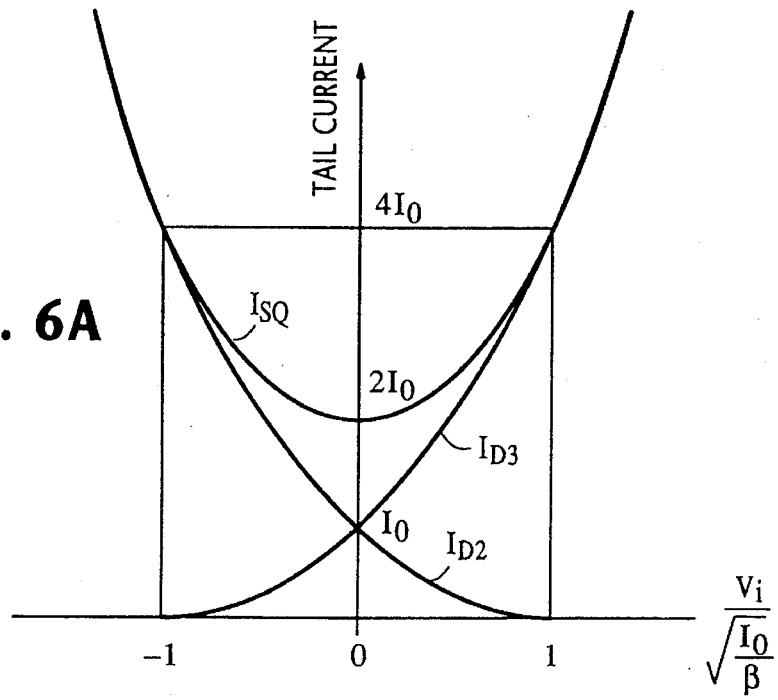
FIG. 6A is a graphic representation of the input-to-output characteristic of the squaring circuit of FIG. 5A.

FIG. 6A is a graphic representation of the input-to-output characteristic of the squaring circuit 22 of FIG. 5A given by Equations (9a) and (9b). FIG. 6A indicates that by using the square-law characteristic of the MOS transistor an ideal square-law characteristic can be obtained for a transconductance amplifier for a range between −1 volt and +1 volt of normalized input voltage. This range is wider than any of the ranges attainable with prior art transconductance amplifiers.

In relation to the tail current $I_{SS}$ given by Equation (3) it is seen that the tail current $I_{SQ}$ must be scaled by a factor ¼ or the input voltage $V_i$ of the squaring circuit 22 must be scaled by a factor ½.

Figure 5B:
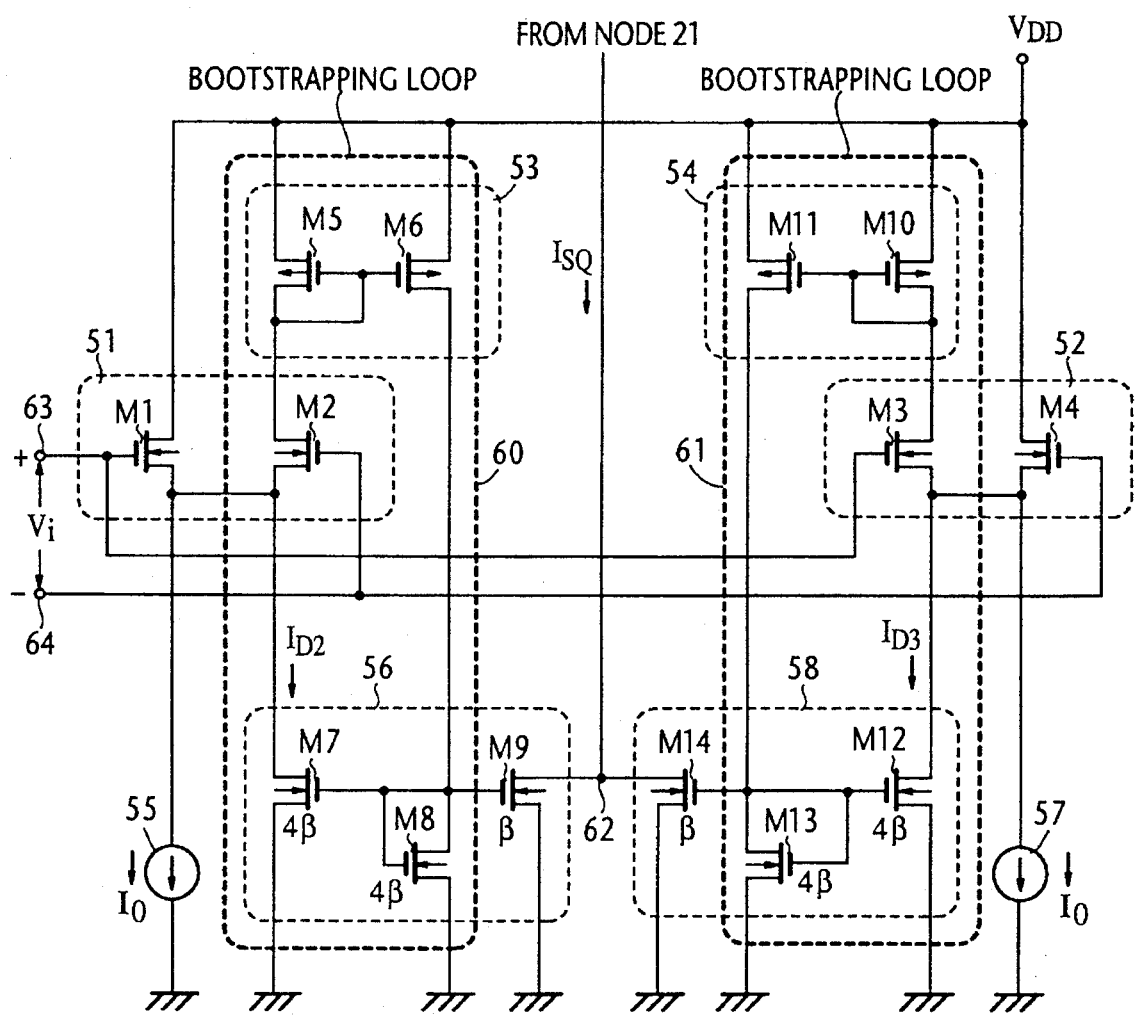
FIG. 5B is a circuit diagram of the squaring circuit according to a modified form of the present invention in which the output current of the squaring circuit is scaled at ¼ of the output current of FIG. 5A.

As illustrated in FIG. 5B, the tail current $I_{SQ}$ can be divided by 4 by setting, in each of the current mirror circuit 56 and 58, the width-to-length ratios (or β-values) of the transistors M7, M8, M12 and M13 provided on the side of the differential pairs (transistors M1, M2, M3, M4) at a value four times higher than the width-to-length ratio of the transistors M9 and M14 which are provided on the output side of these current mirror circuits. The β-values of the other MOS transistors of the squaring circuit are suitably set at an equal value.

Alternatively, the tail current $I_{SQ}$ can be divided by 4 by the provision of a set of four MOS transistors Ma, Mb, Mc and Md as illustrated in FIG. 5C. These transistors have their gate terminals coupled together to a common bias source $V_B$ and their sources coupled together to the node 62. The node 62 is connected to the node 21 via the source-drain path of transistor Ma, while the drain terminals of transistors Mb, Mc and Md are coupled together to the voltage supply $V_{DD}$.

Figure 7A:
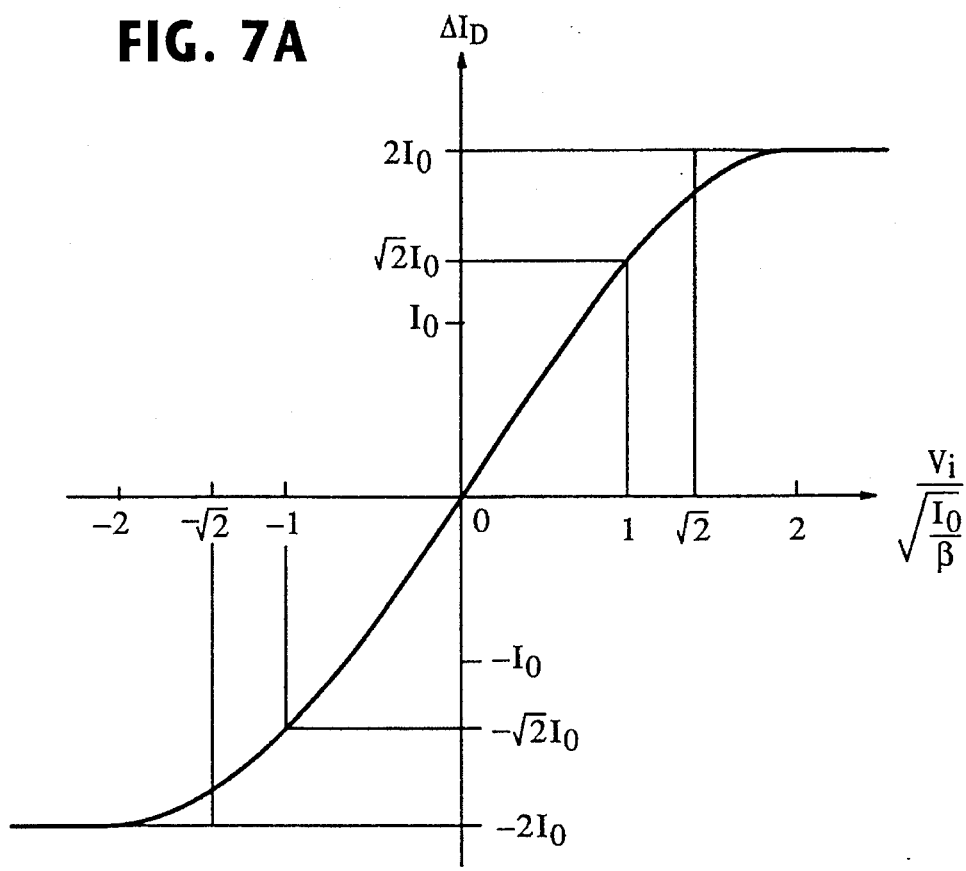
FIG. 7A is a graphic representation of the input-to-output characteristic of the operational transconductance amplifier incorporating the squaring circuit of FIG. 5A.

By scaling the tail current $I_{SQ}$ by a factor ¼ in a manner mentioned above, the MOS differential pair (M26 and M27) linearly operates in the ±1 normalized voltages as indicated by the input-to-output curve of FIG. 7A.

Figure 5D:
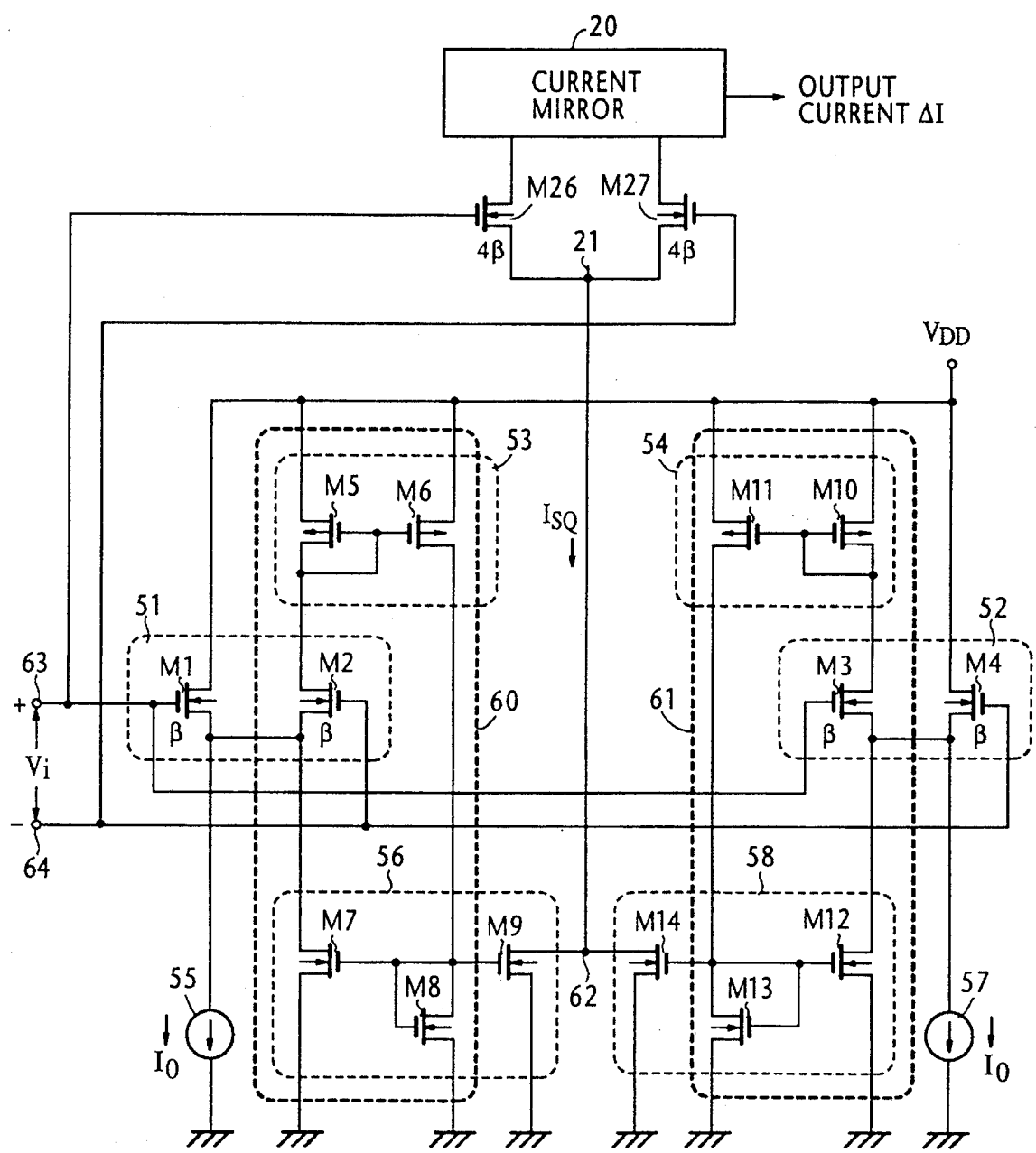
FIG. 5D is a circuit diagram of the squaring circuit according to a further modification of the present invention in which the input voltage of the squaring circuit is equivalently scaled at ½ of the voltage input of the MOS differential pair.

The input voltage can be divided by 2 by setting the input voltage $V_i$ at one-half of the voltage input to the MOS differential pair (M26, M27) or setting the width-to-length ratios (=β-values) of the transistors M26 and M27 of the MOS differential pair at a value four times higher than the width-to-length ratio of the channels of the transistors M1 to M4 as illustrated in FIG. 5D.

Figure 5E:
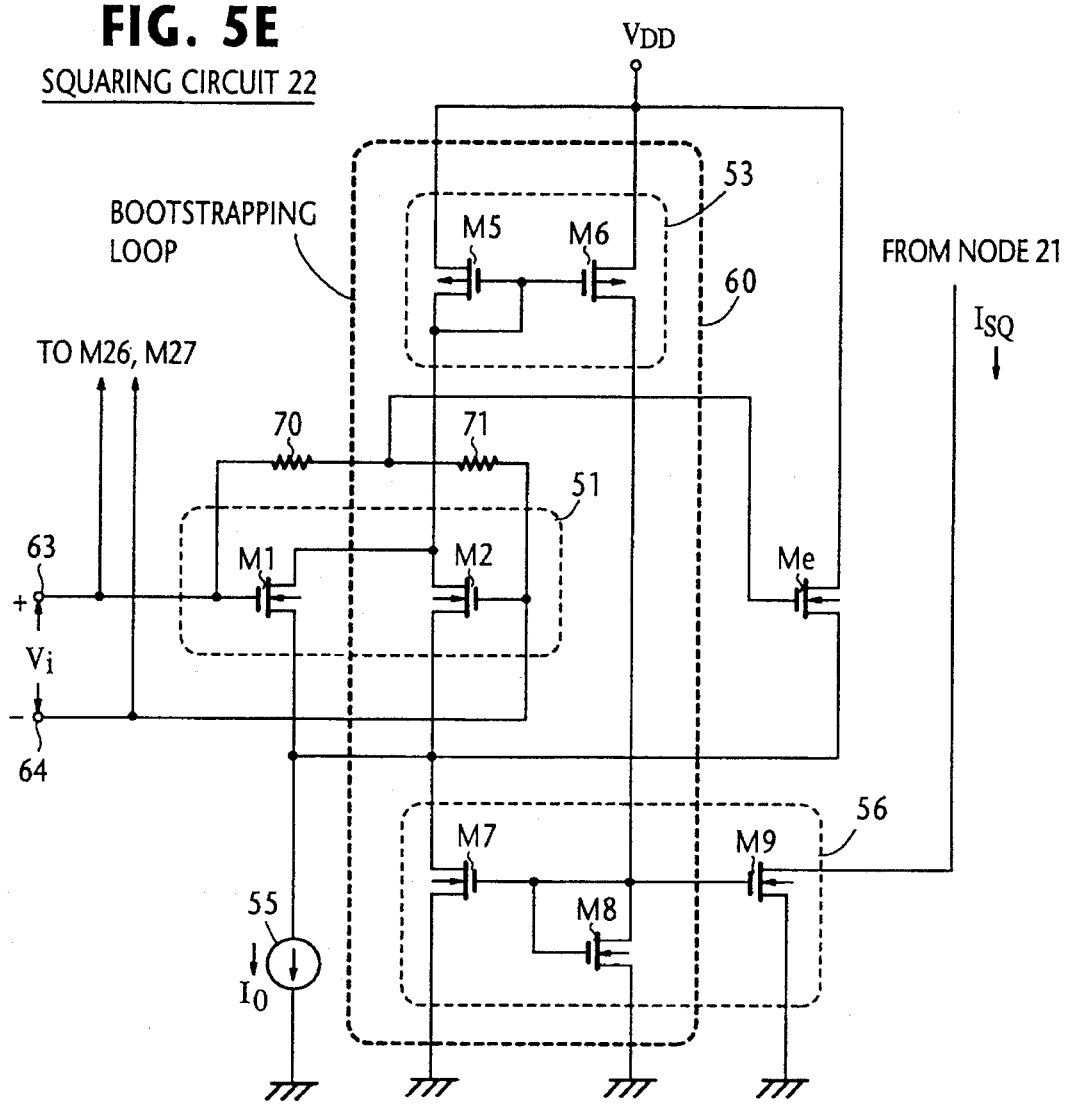
FIG. 5E is a circuit diagram of the squaring circuit according to a still further modification of the present invention in which the input voltage of the squaring circuit is equivalently scaled at ½ of the voltage input of the MOS differential pair.

According to an interesting feature of the present invention, the input voltage can be scaled by a factor ½ to advantage by configuring the squaring circuit 22 of FIG. 5A into simplified circuitry as shown in FIG. 5E. The simplified squaring circuit is formed by a single differential circuit which is generally similar to the first differential circuit of FIG. 5A with the exception the drain terminals of MOS transistors M1 and M2 are coupled together and passed through the source-drain path of MOS transistor M5 to the voltage supply $V_{DD}$, and their gate terminals are coupled by series-connected resistors 70 and 71 of equal value. A MOS transistor Me is provided so that its drain-source path is connected between the voltage supply $V_{DD}$ and the constant current sink 55 as well as to the drain terminal of transistor M7, the gate terminal of transistor Me being connected to the node between resistors 70 and 71. According to this simplified configuration, the tail current $I_{SQ}$ is given by Equation (10) as follows:

$$I_{SQ} = \frac{1}{2} \beta V_i^2 + 2I_0 \left( \text{if } |V_i| \leq 2\sqrt{\frac{I_0}{\beta}} \right) \quad (10)$$

Figure 6B:
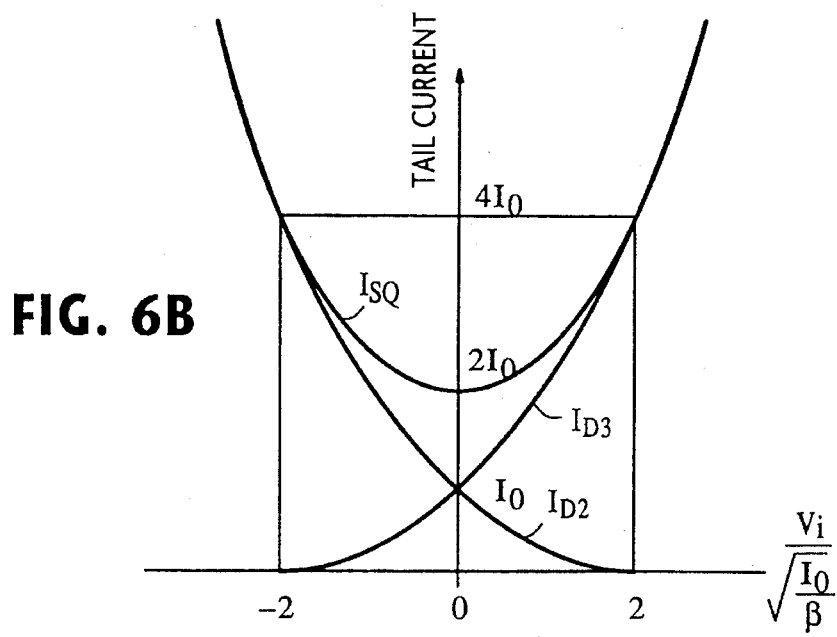
FIG. 6B is a graphic representation of the input-to-output characteristic of the squaring circuits of FIGS. 5B, 5C, 5D and 5E.
Figure 7B:
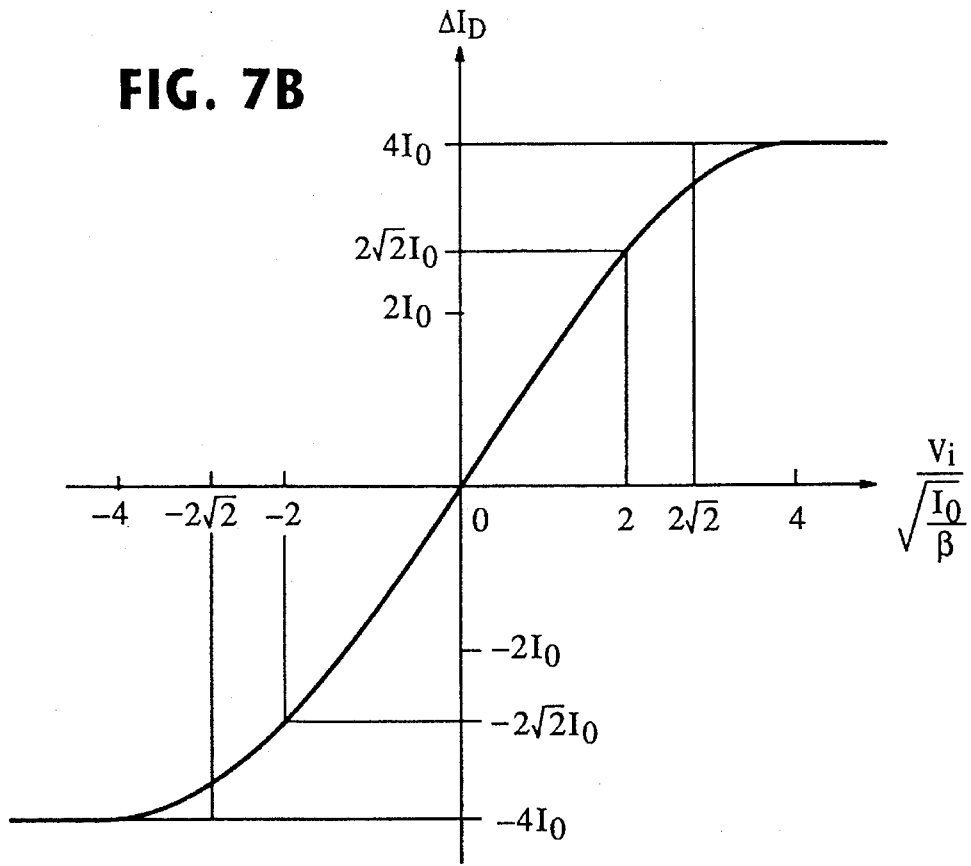
FIG. 7B is a graphic representation of the input-to-output characteristic of the operational transconductance amplifier incorporating the squaring circuits of FIGS. 5B, 5C, 5D and 5E.

As shown in FIG. 6B, the range of linear amplification of the squaring circuits of FIGS. 5B, 5C, 5D and 5E is extended over a range which is twice the range of FIG. 6A. In a similar manner, the linear amplification range of the MOS differential pair can be extended twice the range of FIG. 7A by the squaring circuits of FIGS. 5B, 5C, 5D and 5E as shown in FIG. 7B.

Another important characteristic of the MOS operational transconductance amplifier of this invention is that it can be operated at low voltages.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A metal oxide semiconductor (MOS) operational transconductance amplifier comprising:

a MOS transistor differential pair having gate terminals for receiving an input voltage thereacross and having channels connected together to a first node;

first and second constant current means connected to a reference potential;

a first current mirror connected to a voltage supply, and a second current mirror connected to said reference potential;

a third current mirror connected to said voltage supply, and a fourth current mirror connected to said reference potential, said second and fourth current mirrors being connected together to a second node connected to said first node;

a first MOS transistor having a channel connected between said voltage supply and said first constant current means, and a second MOS transistor having a channel connected at one end to said first current mirror and at the other end to said first constant current means and said second current mirror; and a third MOS transistor having a channel connected at one end to said third current mirror and at the other end to said second constant current means and said fourth current mirror, and a fourth MOS transistor having a channel connected between said voltage supply and said second constant current means;

said first and third MOS transistors having gate terminals thereof coupled together and said second and fourth MOS transistors having gate terminals thereof coupled together for receiving said input voltage, said first and second current mirrors and said second MOS transistor being connected to form a bootstrapping loop so that said second current mirror produces at said second node a first current equal to a sum of a constant current produced by said first constant current means and a current equal to a drain current produced by one of said first and second MOS transistors, said third and fourth current mirrors and said third MOS transistor being connected to form a bootstrapping loop so that said fourth current mirror produces at said second node a second current equal to a sum of a constant current produced by said second constant current means and a current equal to a drain current produced by one of said third and fourth MOS transistors, said first and second currents being combined together at said node to drive said MOS transistor differential pair.

2. A MOS operational transconductance amplifier as claimed in claim 1, said first current mirror comprising a fifth MOS transistor having a channel connected between said voltage supply and the channel of said second MOS transistor and a sixth MOS transistor having a channel connected between said voltage supply and said second current mirror, said fifth and sixth MOS transistors having gate terminals connected together to the channel of said second MOS transistor, said second current mirror comprising a seventh MOS transistor having a channel connected between the channel of said second MOS transistor and said reference potential, an eighth MOS transistor having a channel connected between the channel of said sixth MOS transistor and said reference potential, and a ninth MOS transistor having a channel connected between said second node and said reference potential, said seventh, eighth and ninth MOS transistors having gate terminals connected together to the channel of said sixth MOS transistor, said seventh and eighth MOS transistors having channel-width-to-length ratios four times greater than a channel-width-to-length ratio of said ninth MOS transistor, said third current mirror comprising a tenth MOS transistor having a channel connected between said voltage supply and the channel of said third MOS transistor and an eleventh MOS transistor having a channel connected between said voltage supply and said fourth current mirror, said tenth and eleventh MOS transistors having gate terminals connected together to the channel of said third MOS transistor, said fourth current mirror comprising a twelfth MOS transistor having a channel connected between the channel of said third MOS transistor and said reference potential, a thirteenth MOS transistor having a channel connected between the channel of said eleventh MOS transistor and said reference potential, and a fourteenth MOS transistor having a channel connected between said second node and said reference potential, said twelfth, thirteenth and fourteenth MOS transistors having gate terminals connected together to the channel of said eleventh MOS transistor, said twelfth and thirteenth MOS transistors having channel-width-to-length ratios four times greater than a channel-width-to-length ratio of said fourteenth MOS transistor.

3. A MOS operational transconductance amplifier as claimed in claim 1, further comprising a set of four MOS transistors having gate terminals connected together to be biased, one of the four MOS transistors of the set having a channel connected between said first and second nodes and the other MOS transistors of the set having channels connected between said second node and said voltage supply.

4. A MOS operational transconductance amplifier as claimed in claim 1, wherein the input voltage applied to said first, second, third and fourth MOS transistors is one half of the input voltage supplied to said MOS transistor differential pair.

5. A MOS operational transconductance amplifier as claimed in claim 1, wherein each transistor of said MOS transistor differential pair has a channel-width-to-length ratio four times greater than a channel-width-to-length ratio of each of the first, second, third and fourth MOS transistors.

6. A MOS operational transconductance amplifier as claimed in claim 1, further comprising an additional current mirror connected to said voltage supply, wherein transistors of said MOS transistor differential pair have their channels connected between said additional current mirror and said first node.

7. A metal oxide semiconductor (MOS) operational transconductance amplifier comprising:

a MOS transistor differential pair having gate terminals connected respectively to input terminals for receiving an input voltage thereacross and having channels connected together to a first node;

constant current means connected to a reference potential;

a first current mirror connected to a voltage supply, and a second current mirror connected to said reference potential and a second node connected to said first node;

a first MOS transistor having a channel connected between said first current mirror and said constant current means, and a second MOS transistor having a channel connected at one end to said first current mirror and at the other end to said constant current means and said second current mirror, the gate terminals of said first and second MOS transistors being connected respectively to said input terminals;

first and second resistors of equal value connected in series between gate terminals of said first and second MOS transistors;

a third MOS transistor having a channel connected between said voltage supply and said constant current means and having a gate terminal connected to a third node formed between said first and second resistors;

said first and second current mirrors and said second MOS transistor being connected to form a bootstrapping loop so that said second current mirror produces at said second node a current equal to a sum of a constant current produced by said constant current means and a current equal to a drain current produced by one of said first and second MOS transistors.

8. A MOS operational transconductance amplifier as claimed in claim 7, said first current mirror comprising a fifth MOS transistor having a channel connected between said voltage supply and the channels of said first and second MOS transistors and a sixth MOS transistor having a channel connected between said voltage supply and said second current mirror, said fifth and sixth MOS transistors having gate terminals connected together to the channel of said second MOS transistor, said second current mirror comprising a seventh MOS transistor having a channel connected between the channel of said second MOS transistor and said reference potential, an eighth MOS transistor having a channel connected between the channel of said sixth MOS transistor and said reference potential, and a ninth MOS transistor having a channel connected between said second node and said reference potential, said seventh, eighth and ninth MOS transistors having gate terminals connected together to the channel of said sixth MOS transistor.

9. A MOS operational transconductance amplifier as claimed in claim 7, further comprising an additional current mirror connected to said voltage supply, wherein transistors of said MOS transistor differential pair have their channels connected between said additional current mirror and said first node.

* * * * *